(12) United States Patent
Chao et al.

(10) Patent No.: US 9,748,128 B1
(45) Date of Patent: Aug. 29, 2017

(54) SYSTEMS AND METHODS FOR WAFER ALIGNMENT

(71) Applicant: Micron Technology, Inc., Boise, ID (US)

(72) Inventors: Yang Chao, Boise, ID (US); Keith E. Ypma, Boise, ID (US); Steve J. Strauch, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/170,517

(22) Filed: Jun. 1, 2016

(51) Int. Cl.
*H01L 21/68* (2006.01)
*G03F 9/00* (2006.01)
*G03F 7/20* (2006.01)
*G01B 11/14* (2006.01)

(52) U.S. Cl.
CPC ............ *H01L 21/681* (2013.01); *G01B 11/14* (2013.01); *G03F 7/70775* (2013.01); *G03F 9/7003* (2013.01); *G03F 9/7007* (2013.01); *G03F 9/7015* (2013.01); *G03F 9/7088* (2013.01); *B65G 2203/0233* (2013.01); *B65G 2203/041* (2013.01); *B65G 2811/0626* (2013.01)

(58) Field of Classification Search
CPC ....... H01L 21/68; H01L 21/681; B65G 47/24; B65G 2811/0626; B65G 2203/0233; B65G 2203/0241; B65G 2203/041; G03F 7/70775; G03F 9/00; G03F 9/70; G03F 9/7003; G03F 9/7007; G03F 9/7011; G03F 9/7015; G03F 9/7046; G03F 9/7049; G03F 9/7073; G03F 9/7076; G03F 9/7084; G03F 9/7088; G03F 9/7092; G01B 11/14
See application file for complete search history.

(56) References Cited

U.S. PATENT DOCUMENTS

| | | | | |
|---|---|---|---|---|
| 6,268,920 B1* | 7/2001 | Ohlig | ........................ | G03F 9/00 356/399 |
| 6,539,106 B1* | 3/2003 | Gallarda | .............. | G01R 31/307 382/149 |
| 7,251,883 B2* | 8/2007 | Nakamura | ........... | B41J 2/14024 29/721 |
| 7,812,438 B2* | 10/2010 | Jadhav | .................... | H01L 24/12 257/698 |
| 7,991,218 B2* | 8/2011 | Toyoda | ................... | G06T 7/001 382/151 |
| 8,592,287 B2* | 11/2013 | Shih | ........................ | G01N 23/04 257/797 |
| 9,299,663 B2* | 3/2016 | Wirz | .................... | H01L 21/0274 |
| 2014/0282305 A1* | 9/2014 | Shen | ................... | G06F 17/5072 716/55 |

OTHER PUBLICATIONS

"Alignment Algorithm for Determining Via Centers of Substrate Layers," IBM Technical Disclosure Bulletin, Apr. 1994, vol. 37, Issue 4B, pp. 57-64.*

* cited by examiner

*Primary Examiner* — Gordon J Stock, Jr.
(74) *Attorney, Agent, or Firm* — Perkins Coie LLP

(57) ABSTRACT

Various embodiments of aligning wafers are described herein. In one embodiment, a photolithography system aligns a wafer by averaging individual via locations. In particular, some embodiments of the present technology determine the center locations of individual vias on a wafer and average them together to obtain an average center location of the set of vias. Based on a comparison of the average center location to a desired center location, the present technology adjusts the wafer position. Additionally, in some embodiments, the present technology compares wafer via patterns to a template and adjusts the position of the wafer based on the comparison.

20 Claims, 9 Drawing Sheets

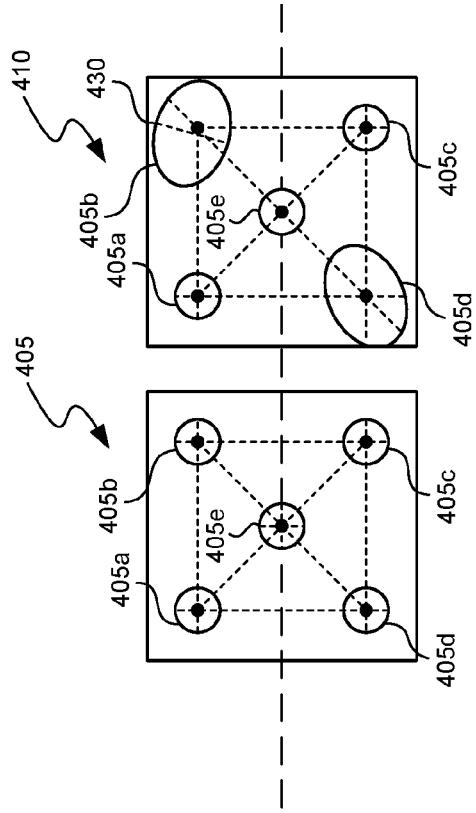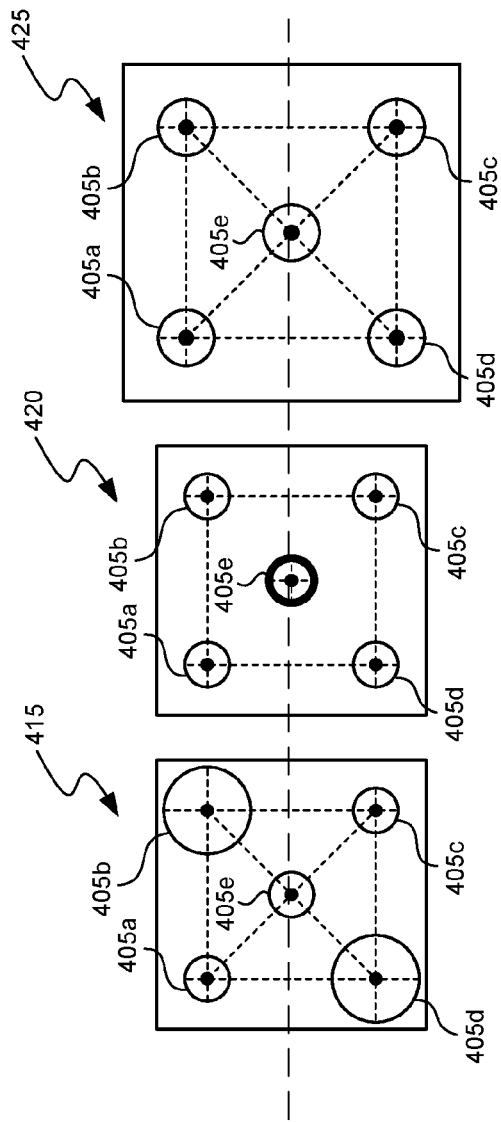

SYSTEMS AND METHODS FOR WAFER ALIGNMENT

TECHNICAL FIELD

The present technology is related to aligning a wafer. In particular, some embodiments of the present technology determine the center locations of individual vias fabricated on a wafer and average them together to obtain an average center location of the set of vias. Based on a comparison of the average center location to a desired center location, the present technology adjusts the wafer position.

BACKGROUND

Photolithography is a process commonly used in semiconductor fabrication for selectively removing portions of a thin film from or depositing portions of a film onto discrete areas of a surface of a semiconductor wafer. A typical photolithography process includes spin coating a layer of a radiation-sensitive material (commonly referred to as a "photoresist") onto the surface of the semiconductor wafer. The semiconductor wafer is then exposed to a pattern of radiation that chemically modifies a portion of the photoresist incident to the radiation. The process further includes removing either the exposed portion or the unexposed portion of the photoresist from the surface of the semiconductor wafer with a chemical solution (e.g., a "developer") to form a pattern of openings through the photoresist corresponding to the pattern of radiation. Subsequently, portions of the thin film on the surface of the semiconductor wafer can be selectively removed, or portions of a thin film can be deposited onto the surface of the wafer, through the openings of the photoresist mask. The photolithography process can be repeated to form layers of microelectronic features on or in the wafer. Vias, such as through-silicon vias (TSVs), are one type of structure that can electrically connect components in different layers.

An important aspect of semiconductor processing is aligning the wafer with respect to a processing tool, and in particular photolithography tools. Modern integrated circuits have multiple layers (e.g., 30 or more) that need to be aligned as they are formed on the wafer. Traditionally, one or more alignment marks are formed on the wafer at the beginning of a manufacturing process. The alignment marks provide an indicator of a reference point or reference structure of a wafer. The marks are used to determine the relative orientation of the wafer with respect to a processing tool. However, typical fabrication and packaging processes, such as oxide growth, planarization, or metal deposition, often change critical features of the marks. For example, deposition processes, oxide growth, and removal processes can change marks that start out as trenches to mesas, or the processes can alter the color, contrast, or other properties of the marks. The changes in the alignment marks may cause misalignment among the layers, which in turn can cause short-circuiting, misaligned vias, disconnections, and other forms of device failure.

In addition to or in lieu of dedicated alignment marks, TSVs or other types of vias formed on the wafer can be used to align the wafer with a processing tool. For example, a set of TSVs or other components of a wafer can be used as an alignment mark in a manner similar to dedicated alignment marks. In the case of TSVs, the size, shape, location, and topography of individual TSVs can vary and be within manufacturing tolerances. However, such variances in the TSVs can make it difficult to use sets of TSVs as alignment marks.

One alignment method is manual alignment. Operators using a microscope view the position of a wafer and make adjustments as needed by using a computer that controls an actuator to move a wafer support carrying the wafer. This method is slow, is inaccurate, and has a high yield loss due to misalignment even among the most conscientious operators. Other methods such as wafer probing and mechanically scanning point sensors have automated the manual process. However, these methods continue to produce wafers with high yield loss or devices that malfunction due to misalignment. Accordingly, the need exists for systems and methods that reduce misalignment.

BRIEF DESCRIPTION OF THE DRAWINGS

Many aspects of the present technology can be better understood with reference to the following drawings. The components in the drawings are not necessarily to scale and instead primarily illustrate the principles of the present technology.

FIGS. 4A-4E illustrate various via patterns in accordance with embodiments of the present technology.

DETAILED DESCRIPTION

Figure 1:
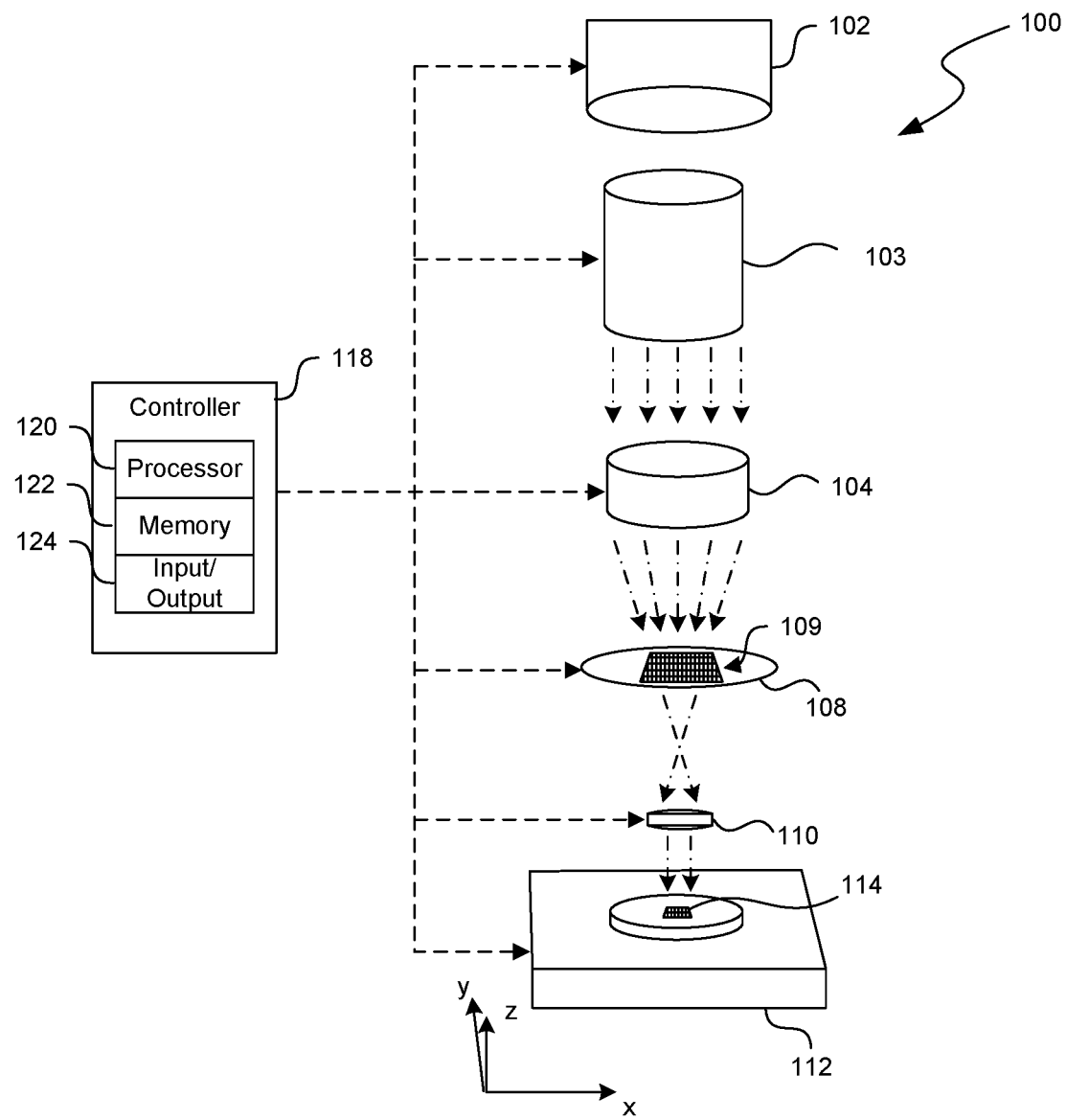
FIG. 1 is a schematic view of a photolithography system in accordance with an embodiment of the present technology.

Several embodiments of the present technology are described below with reference to processes for aligning a wafer. In one embodiment of the technology, a semiconductor processing system determines the average center location of a set of individual vias based on the individual center locations of the individual vias in the set. The semiconductor processing system compares the average center location to a desired reference location and adjusts the relative position between the wafer and the tool based on this comparison. The desired reference location can be a camera center, a reference point on a via template, or another desired location. In general, this is a fine alignment process that is performed after a coarse alignment process (e.g., alignment based on a template).

In one embodiment of the present technology, a photolithography system or other type of processing tool with an alignment module captures digital imaging data of a wafer and compares the digital imaging data of the wafer to a reference template. For example, the photolithography system can recognize or verify a pattern of vias fabricated on the wafer (e.g., five vias arranged as four corner vias and one center via), determine the relative position of the wafer with respect to the tool based on a comparison between the via pattern and the reference template, and move the wafer into a desired alignment as needed.

Many details of certain embodiments are described below with reference to semiconductor devices. The term "semiconductor device" is used throughout to include a variety of articles of manufacture, including, for example, individual integrated circuit dies, imager dies, sensor dies, and/or dies having other semiconductor features. Several of the processes described below may be used to align electrical features on and/or in an individual die or a plurality of dies. The wafer or wafer portion (e.g., wafer form) can be unsingulated silicon or a repopulated carrier wafer. The repopulated carrier wafer can include an adhesive material (e.g., a flexible adhesive), which is surrounded by a generally rigid frame having a perimeter shape comparable to that of an unsingulated wafer, and singulated elements (e.g., dies) surrounded by the adhesive. Overall, when describing the alignment of a wafer in this disclosure, alignment may refer to aligning portions of the wafer such as a die or dies or an entire wafer.

Several embodiments of the present technology are expected to have several advantages compared to existing alignment techniques, as explained more fully below. First, alignment errors are reduced, which reduces the production of aborted or faulty wafers. Second, the cost for reworking wafers or rebuilding wafers is also reduced. Third, the risk of short-circuits, connection failures, and yield loss caused by misalignment is also reduced. Other advantages will become apparent to those having ordinary skill in the art based on this disclosure. Also, all of the advantages of the present technology may not be included in all embodiments described below.

Photolithography System

FIG. 1 is a schematic view of a photolithography system 100 configured in accordance with an embodiment of the disclosure. The photolithography system 100 can be used to align a wafer and perform processes for semiconductor manufacturing (e.g., expose the wafer to light). It will be appreciated that the present technology is not limited to photolithography systems but is also applicable to other semiconductor processing tools that require accurate alignment of a wafer to the processing tool or other element. For example, the present technology can be used in laser cutting and drilling tools, saws, 3-D printing tools, and other processes that align the wafer. For purposes of illustration, the photolithography system 100 includes an image sensor 102, an illumination source 103, a condenser lens 104, a reticle 108, an objective lens 110, and a substrate support 112 arranged in series.

As shown in FIG. 1, a controller 118 is operatively coupled to the various components of the photolithography system 100 for monitoring or controlling the operation of these components. Although not shown in FIG. 1, the photolithography system 100 can also include a substrate transport station, a structural support (e.g., a reticle support, a lens support, etc.), position sensors (e.g., a scatterometer), an immersion hood, a support actuator (e.g., an electric motor), and/or other suitable mechanical and/or electrical components. In general, the controller 118 can move a wafer before, during, and/or after a semiconductor manufacturing process. For example, a wafer 114 can undergo photoresist developing, baking, cleaning, layering (e.g., adding layers), and/or other suitable processing, and the photolithography system 100 can align the wafer 114 before, during, and/or after these processes.

The controller 118 can include a processor 120 coupled to a memory 122 and an input/output component 124. The processor 120 can be a microprocessor, a field-programmable gate array, and/or other suitable logic devices. The memory 122 can include volatile and/or nonvolatile media (e.g., ROM, RAM, magnetic disk storage media, optical storage media, flash memory devices, and/or other suitable storage media) and/or other types of computer-readable storage media configured to store data. The memory 122 can store algorithms for alignment, edge detection, grayscale image processing, filters, and shape recognition that can be executed by the processor 120. In some embodiments, the processor 120 can send data to a computing device operatively coupled (e.g., over the Internet) to the controller 118, such as a server or personal computer. The input/output component 124 can include a display, a touch screen, a keyboard, a mouse, and/or other suitable types of input/output devices configured to accept input from and provide output to an operator.

In the embodiment illustrated in FIG. 1, the image sensor 102 is configured to capture light reflected from a wafer and send the captured image data to the controller 118, where it is stored in the memory 122, processed by the processor 120, and/or sent to the input/output component 124. In some embodiments, the image sensor 102 is configured to capture radiation that is not in the visible spectrum, such as UV light or infrared radiation. Alternatively, the image sensor 102 can capture imaging data of a wafer in both the visible and nonvisible radiation spectrums and send this imaging data to the controller 118. Although not shown in FIG. 1, the image sensor 102 can include a lens, aperture, image sensing component, digital signal processor, and analog or digital output. Although the image sensor 102 is shown above the illumination source 103 in FIG. 1, in some embodiments the image sensor 102 can be spaced laterally apart from the support substrate, and a mirror can be added to reflect light into the image sensor 102.

Also shown in FIG. 1, the illumination source 103 can include an ultraviolet light source (e.g., a fluorescent lamp), a laser source (e.g., an argon fluoride excimer laser), and/or other suitable electromagnetic emission sources. In certain embodiments, the illumination source 103 can be configured to produce generally coherent illumination at a single frequency. In other embodiments, the illumination source 103 can also be at least partially incoherent. In further embodiments, the illumination source 103 can also be configured to generate illumination at multiple frequencies.

The condenser lens 104 and the reticle 108 project a pattern of radiation onto the wafer 114. The reticle 108, for example, can include an opaque plate with lines, apertures, and/or transparencies that allow the radiation from the illumination source 103 to pass through in a defined pattern 109. Below the reticle 108, the objective lens 110 can be configured to project the illumination from the reticle 108 onto a photoresist of the wafer 114.

The substrate support 112 can be configured to carry and/or move the wafer 114. The substrate support 112 can include a vacuum chuck, a mechanical chuck, and/or other suitable supporting devices. Although not shown in FIG. 1, the photolithography system 100 can include at least one actuator configured to move the substrate support 112 laterally (as indicated by the X-axis), transversely (as indicated by the Y-axis), and/or vertically (as indicated by the Z-axis) relative to the reticle 108 and/or other components of the photolithography system 100. In certain embodiments, the substrate support 112 can also include a position transmitter (not shown) configured to monitor the position of the substrate support 112 along the X-axis, the Y-axis, and/or the Z-axis. Even though only one substrate support 112 is shown in FIG. 1, in certain embodiments, the photolithography system 100 can include two, three, or any desired number of substrate supports with structures and/or functions that are generally similar to or different than the substrate support 112. In operation, the controller 118 can position the substrate support 112 to properly align the wafer 114 with the pattern of radiation from the objective lens 110 according to aspects of the present technology described below.

Wafer Alignment Technology

Figure 2A:
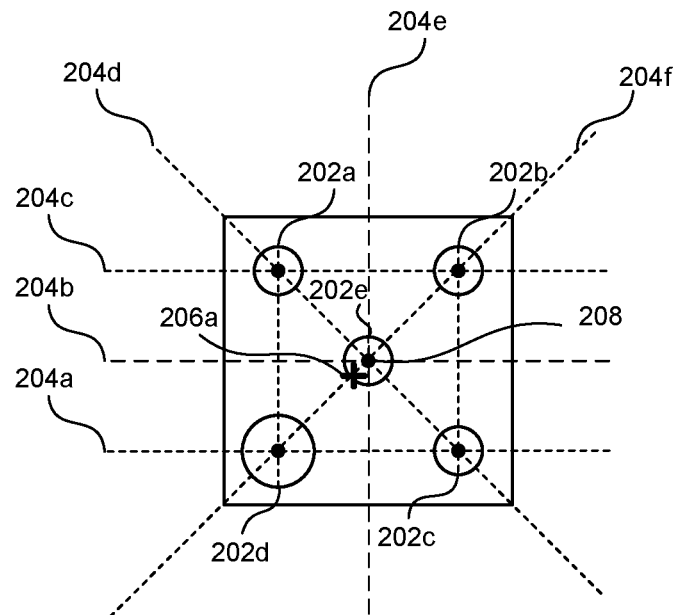
FIG. 2A is an illustrative top view of wafer alignment based on a whole via pattern procedure in accordance with existing alignment techniques.

FIG. 2A is a top view of a set of vias used in aligning a wafer to a processing tool, such as the photolithography system 100 described above with reference to FIG. 1, in accordance with an existing whole via pattern alignment technique. FIG. 2A shows a set of five vias 202a-e, a set of reference lines 204a-f, a calculated center location 206a, and a desired center location 208. It will be appreciated that the five vias 202a-e are formed on the wafer, but the reference lines 204a-f, calculated center 206a, and desired center 208 are data and not features formed on the wafer. As shown in FIG. 2A, via 202d has a longer radius than vias 202a-c (e.g., 1.5 times the radius of the other via radii). Also, all the vias 202a-e in FIG. 2A have the same circular shape.

In existing whole via pattern alignment processes, the calculated center 206a is determined by averaging the light intensity reflected from the whole via pattern. For example, because the reflection from vias is generally brighter (e.g., more intense) than from other materials or structures of the substrate, the whole via pattern alignment algorithm determines an average center location of the whole via pattern based on the light intensity received from the whole via pattern during an imaging process. In some implementations, the whole via pattern alignment algorithm can include filtering, edge detection, pattern detection, and/or shape recognition algorithms to determine the average center location. In the example shown in FIG. 2A, the calculated center 206a is located down and to the left of the desired center 208 because the longer radius of via 202d will cause the lower-left quadrant to have a higher light intensity than the other quadrants, which skews the calculated center down and left. As a result, the calculated center 206a is not aligned with the desired center 208, and this may result in an alignment error.

There are some shortcomings to the whole via pattern alignment algorithm described above with respect to FIG. 2A. One shortcoming is that if some of the vias are larger or smaller than others, the calculated center of the whole via pattern can be located disproportionately away from a desired center (e.g., a camera view center) even though the pattern of vias is actually aligned with the desired center. FIG. 2A is a good example of this because the centers of the vias 202a-e are at the intersections of the reference lines 204a-f, but the calculated center 206a is not aligned with the desired center 208. This could result in a false offset that would cause the wafer to be moved to align the calculated center 206a with the desired center 208, which in turn would misalign the wafer with respect to the processing tool.

Another shortcoming is that if a via is misshaped (e.g., it is an oval, has a defective edge, or has an uneven gradient level), the calculated center of the via can be located disproportionately away from an actual center. This can result in false negatives similar to the example shown in FIG. 2A.

Figure 2B:
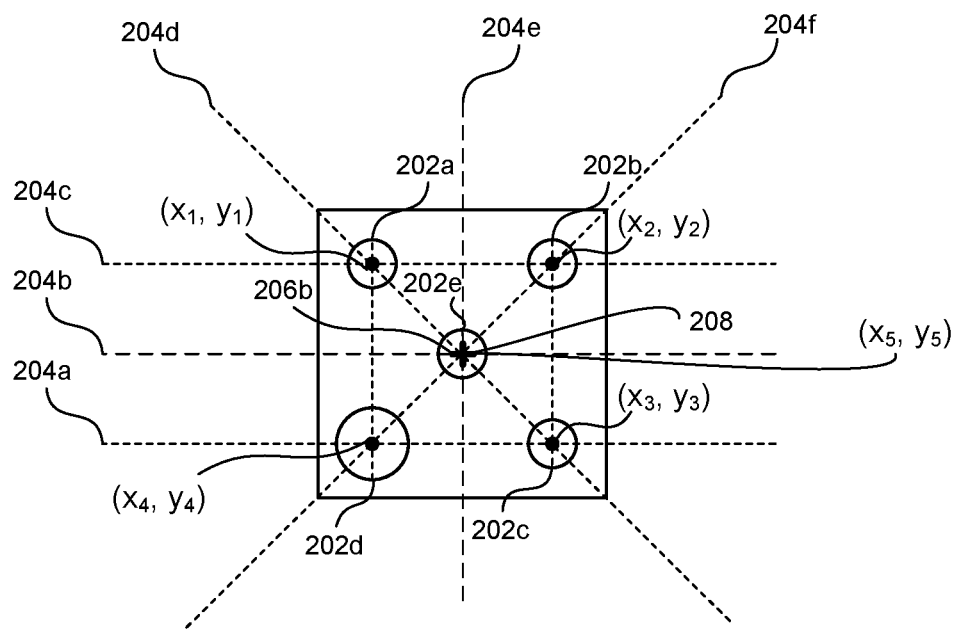
FIG. 2B is an illustrative top view of wafer alignment based on individual via locations in accordance with an embodiment of the present technology.

FIG. 2B is a top view of the same set of vias 202a-e shown in FIG. 2A, but with a calculated center 206b processed in accordance with an embodiment of the present technology for fine alignment that aligns the wafer based on individual via locations in a via pattern. In this embodiment, the calculated center 206b is the average center location of the centers of the individual vias 202a-e in the set of vias (also referred to as "the individual via location alignment algorithm"). When the centers of the individual vias 202a-e are located at the intersections of the reference lines 204a-f, the calculated center 206b coincides with the location of the desired center 208 even if the sizes, shapes, or topographies of the individual vias 202a-e are different from each other. Because the individual via location alignment algorithm is based on the averaging of the center of individual vias for a via pattern and not the whole via pattern as described in FIG. 2A, the calculated center 206b is in the same location as the desired center 208. Some of the advantages of the individual via location alignment algorithm include reducing the influence of via size, shape, and location on determining the average center location, which reduces alignment errors, as described in more detail in FIGS. 4-5.

In some implementations, the individual via location alignment algorithm can include algorithms for filtering, edge detection, pattern detection, clustering, and/or shape recognition to determine the average center location of individual vias. For example, the photolithography system determines the center of individual vias in a via pattern by filtering the imaging data based on brightness and then uses clustering algorithms to identify the center coordinate (x, y) of each via. In some embodiments, the photolithography system can use edge detection, grayscale matching, and/or gradient scale digital image processing algorithms to determine the center location of each via in a set of vias.

As shown in FIG. 2B, the photolithography system can determine five center coordinates: $(x_1, y_1)$ for 202a, $(x_2, y_2)$ for 202b, $(x_3, y_3)$ for 202c, $(x_4, y_4)$ for 202d, and $(x_5, y_5)$ for 202e. The center coordinates correspond to the center of each via based on imaging processes data and the individual via location alignment algorithm described above. The photolithography system computes the average center of the set of vias by computing the average x and y coordinates of the vias using the formulas described below in Equations 1 and 2, where "n" is the number of vias, and for each via center there is a center x coordinate and center y coordinate.

$$\text{average } x \text{ coordinate} = \frac{1}{n}\sum_{i=1}^{n}(x_i) \qquad \text{Equation 1}$$

$$\text{average } y \text{ coordinate} = \frac{1}{n}\sum_{i=1}^{n}(y_i) \qquad \text{Equation 2}$$

For the set of vias shown in FIG. 2B, the photolithography system determines the average center coordinates ($x_{average}$, $y_{average}$) based on Equation 1 and Equation 2. In the example of FIG. 2B, the average center coordinates ($x_{average}$, $y_{average}$) are equal to ($x_5$, $y_5$). Yet one will appreciate that the average center coordinates ($x_{average}$, $y_{average}$) will vary from ($x_5$, $y_5$) as the shape, size, and location of vias 202*a-e* vary. Some examples of variation due to shape, size, and location are shown in FIGS. 4A-4E.

In some embodiments, the photolithography system determines whether the average center is within a tolerated range. A tolerated range can be a distance determined by an operator that satisfies the alignment requirements for the wafer. For example, the photolithography system can determine that the average center location of a set of vias fabricated on a wafer is 1 micrometer away from a desired camera center. In such an example, if the tolerated range is 1-2 micrometers, then the photolithography system can determine that the wafer is within a tolerated range.

Example Imaging Data Illustrations

Figure 3A:
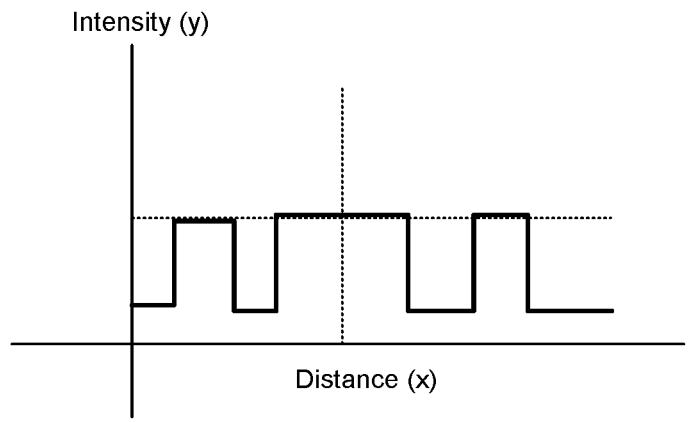
FIGS. 3A-3C are graphs illustrating imaging data for a wafer in accordance with embodiments of the present technology.
Figure 3B:
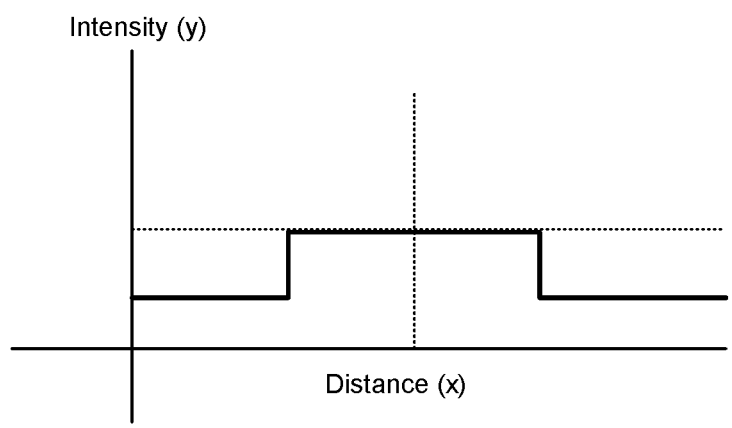
Figure 3C:
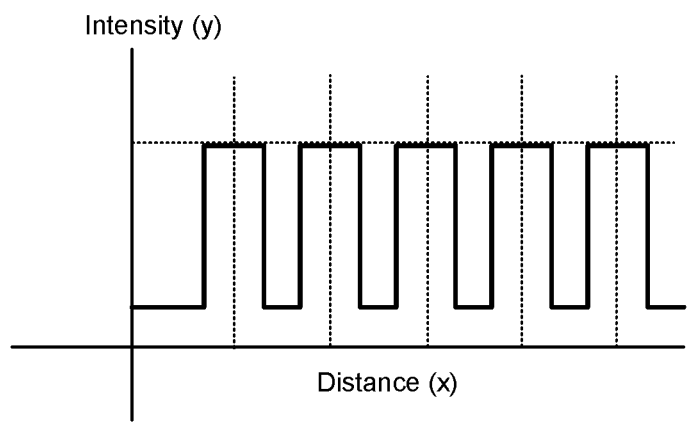

FIGS. 3A-3C are graphs illustrating imaging data for a wafer in accordance with embodiments of the present technology. The photolithography system described in FIG. 1 can use the imaging data to determine location, size, grid level, and center location of vias. The x-axis in these Figures is distance (e.g., in micrometers) in a horizontal or vertical direction (e.g., y or x direction on a wafer). Additionally, the y-axis represents light intensity. Light intensity is brightness of reflected light from a wafer received by an image sensor. Light intensity can be measured in a photometric quantity, such as lumens per steradian (lm/sr), or radiant intensity, such as watts per steradian (W/sr).

FIG. 3A is a graph with three vias represented by the three peak values and three blocks. The center block is wider than the other blocks because the via corresponding to the center block is wider than the other vias (e.g., has a larger diameter). For example, the larger via can be associated with via 202*d* as compared to vias 202*a-c*, as shown in FIG. 2A (three blocks appear in FIG. 3A for simplicity, but there could be a fourth or fifth block to represent the fourth via or the fifth via).

FIG. 3B is a graph with one via. As shown in FIG. 3B, the graph includes one step function where the higher value represents a via that reflects brighter or more intense light, and the lower value represents a substrate that reflects less bright or less intense light. In some implementations, the photolithography system can gather imaging data and then produce a graphical illustration for each via similar to FIG. 3B. Additionally, the graphical illustrations for each via can be compared to determine center locations in the x or y direction.

FIG. 3C illustrates an imaging data graph for a wafer with a set of five vias. As shown in FIG. 3C, the five vias have a maximum light intensity represented by the blocks. The lower light intensity represents the substrate surface. Overall, FIG. 3C illustrates that the five vias are the same size and spaced in a particular pattern relative to each other. Also, the photolithography system can use the spacing between maximum light intensity peaks (e.g., blocks) to determine the spacing between vias.

Various Embodiments of Vias

FIGS. 4A-4E includes five via patterns: 405, 410, 415, 420, and 425. Each pattern has vias 405*a-e*, but as shown in FIG. 4A-4E, individual via size, grid level, and shape varies. FIGS. 4A-4E also include dashed lines as references for illustrating the center of each via. In particular, FIG. 4B includes reference line 430, which illustrates that the center of via 405*b* is not aligned with the center of via 405*e*. The patterns illustrated in FIGS. 4A-4E are simple examples of how variation in vias can create alignment challenges.

Starting with FIG. 4A, all vias 405*a-e* in pattern 405 are centered and have the same size and shape (also referred to as an "ideal" via pattern). In contrast, FIG. 4B has a via pattern 410 with two vias, 405*a* and 405*c*, that are circular in shape and equal in size, and two vias that are oval-shaped and not equal in size, 405*b* and 405*d*. The center locations of vias 405*a* and 405*c-e* are located at the desired locations of the ideal pattern, so even though the larger vias will reflect more light, the photolithography system can align the pattern based on individual centers and not just intensity of light received at an image sensor. Also in FIG. 4B, the center of via 405*b* is not aligned with the location of the ideal pattern, as shown by dashed line 430. However, the offset of via 405*b* does not cause the alignment process of the present technology to shift the computed average center of the entire via pattern based on the full reflection of the larger via 405*b*, and by averaging the five via centers together, the impact of the offset of via 405*b* is only 20% of the weighting in the average. Thus, in computing an average center based on individual centers for the set of vias in pattern 410 where four of five vias are properly aligned, the present technology reduces the impact of a center that is misaligned by a percentage (e.g., 80% accuracy in a five-via pattern, where four via centers are aligned and one via center is misaligned).

Similar to pattern 410 of FIG. 4B, FIG. 4C shows pattern 415 with two circular-shaped vias that are the same size, vias 405*a* and 405*c*. Yet pattern 415 has two vias, 405*b* and 405*d*, that are circular-shaped and larger than the other two vias. In contrast to via patterns 410 and 415 with even grid levels, FIG. 4D shows pattern 420 with a via 405*e* that has an uneven grid level, as shown by the bold circle around via 405*e*. In some embodiments, a grid level means the leveling of via 405*e* is higher or lower in one area of the via than in another area, which creates some misalignment (e.g., in the z direction). The photolithography system can detect grid level based on the imaging data for a wafer such as the variation in gray level because higher substrate may be darker than lower substrate.

Additionally, FIG. 4E illustrates pattern 425, which is a magnified view of pattern 405. As described in the alignment process below, the photolithography system determines an average center of a set of vias based on individual center locations; therefore, the magnification level of a camera or viewing tool likely does not affect the average center location calculation. One expected advantage of being agnostic to magnification is that operators can perform alignment at any level of magnification.

Alignment Processes

Figure 5:
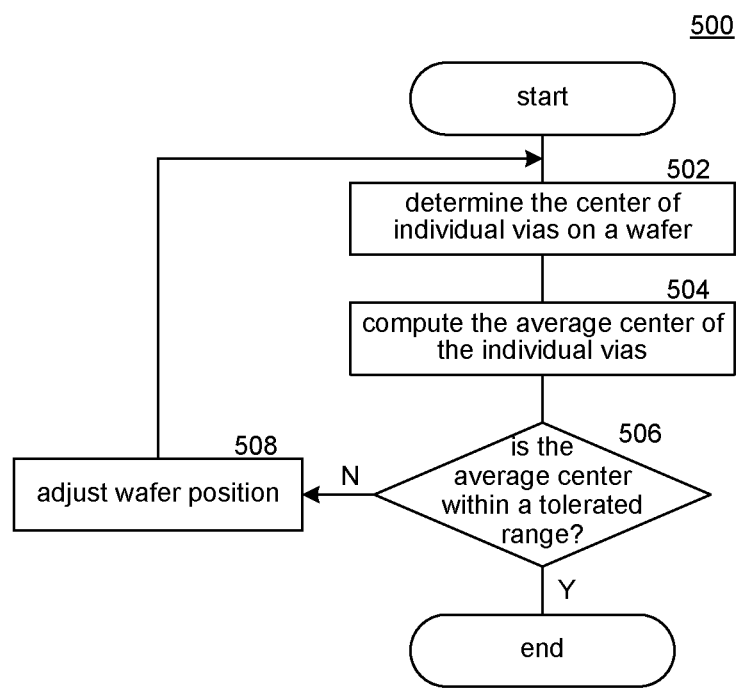
FIG. 5 is a flow chart of a process for fine alignment of a wafer in accordance with embodiments of the present technology.

FIG. 5 illustrates a process 500 for fine alignment of a wafer in accordance with embodiments of the present technology. The process 500 can begin when an image sensor detects a wafer or when a technician using a computer requests to align a wafer in the photolithography system. The process starts at block 502 and continues to block 504.

At block 502, the photolithography system determines the center of individual vias on a wafer. In one embodiment, the photolithography system uses the imaging data, which can include brightness and/or intensity data used to identify the center coordinate (x, y) of each via. In some embodiments, the photolithography system can use a filter to determine where the dark (e.g., substrate) and light (e.g., vias) regions of an image are located. Additionally, the photolithography system can use edge detection, grayscale matching, clustering, mean distribution, and/or gradient scale digital image processing algorithms to determine the center location of each via in a set of vias. As an example, for a wafer with five vias, the photolithography system can determine five coordinates—$(x_1, y_1)$, $(x_2, y_2)$, $(x_3, y_3)$, $(x_4, y_4)$, and $(x_5, y_5)$—that correspond to the center of each via.

At block 504, the photolithography system computes the average center of the individual vias. In one embodiment, the photolithography system computes the average center by computing the average x and y coordinates of the vias using the formula described above in Equations 1 and 2, where "n" is the number of vias, and for each via center there is a center x coordinate and a center y coordinate.

At decision block 506, the photolithography system determines whether the average center is within a tolerated range. A tolerated range can be a distance determined by an operator that satisfies the alignment requirements for a wafer. For example, the photolithography system can determine that the average center location of a set of vias fabricated on a wafer is 1 micrometer away from a desired camera center. In such an example, if the tolerated range is 1-2 micrometers, then the photolithography system can determine that the wafer is within a tolerated range. Alternatively, if the average center location is determined to be 2.5 micrometers, the photolithography system can proceed to step 508 to adjust the position of wafer.

At block 508, the photolithography system adjusts the position of the wafer. The photolithography system can adjust the position of the wafer so that the wafer is within the tolerated range (e.g., within a particular distance of a camera center or a reference location on the wafer). For example, the photolithography system can determine that a wafer is 0.5 micrometers too far right at block 506, and in block 508, the photolithography system will move the wafer 0.5 micrometers to the left. If the processor determines that the wafer is aligned, the process 500 ends. After block 508, the process 500 can return to block 502 to determine whether the adjustments now place the wafer in a tolerated range. Also, although not shown in FIG. 5, the process 500 can end after block 508.

There are several expected advantages of the process 500. One advantage is that the size of a via is less significant in causing an alignment error when averaging individual centers of vias as compared to a whole via pattern. Additionally, because an averaging process is included in the process 500, if an individual via center is out of line or poorly shaped, it will have a reduced effect on the average center. For example, in the five-via example, if one via is misshaped or not centered and the other vias are shaped properly and centered, the alignment error of this via may be reduced by 80%. As the number of vias increases, the alignment error of individual vias will be even further reduced as described below with reference to FIGS. 9A-9I.

Additional Alignment Process

As described above with reference to the process 500, the present technology can align a wafer to a reference location or tool based on computing an average center location of a set of individual vias. Yet, as described in more detail below, the process 500 can be combined with a coarse alignment process that occurs before the process 500 described above. Specifically, the coarse alignment process aligns a wafer using a template and/or verifies that a via pattern (e.g., three, four, or five) matches a template before beginning the process 500.

Figure 6:
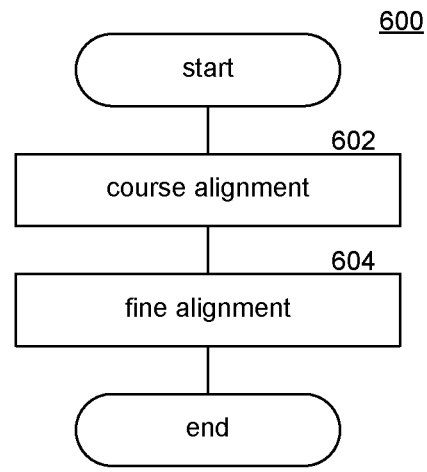
FIG. 6 is a flow chart of a process including fine and coarse alignment of a wafer in accordance with embodiments of the present technology.
Figure 7:
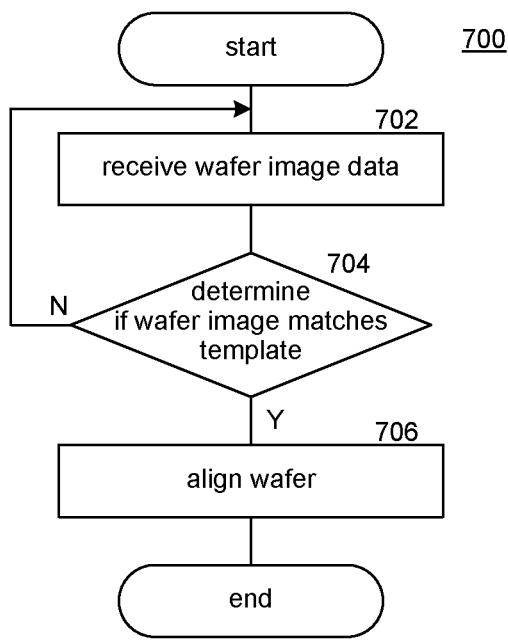
FIG. 7 is a flow chart of a process for coarse alignment of a wafer in accordance with embodiments of the present technology.

FIGS. 6-7 illustrate representative processes for aligning a wafer utilizing a coarse and fine alignment. Specifically, FIG. 6 illustrates a process 600 for aligning the position of a wafer based on a template at block 602 and for subsequently further aligning the position of the wafer based on comparison of a desired center to an average calculated center. The process 600 can be automated by the controller when an image sensor detects a wafer in the photolithography system 100. Alternatively, the overall process 600 can begin when a technician uses a graphical user interface (GUI) on a computer, coupled to the photolithography system 100, to request the alignment of a wafer or to perform a process that requires the wafer to be aligned. The process 600 begins at block 602 and continues to block 604. Block 602 is described in more detail with respect to FIG. 7, and block 604 is described in more detail with respect to FIG. 5 previously described above.

FIG. 7 illustrates a process 700 for coarse alignment of a wafer in accordance with embodiments of the present technology. Coarse alignment refers to aligning a wafer to a tool or location based on a via template. As a broad overview of the process 700, a photolithography system or other type of processing tool with an alignment module captures digital imaging data of a wafer and compares the digital imaging data of the wafer to a reference template to verify a pattern of vias fabricated on the wafer (e.g., five vias arranged as four corner vias and one center via), determine the relative position of the wafer with respect to the tool based on a comparison between the via pattern and the reference template, and move the wafer into a desired alignment as needed. The process 700 can begin when a wafer is placed in the photolithography system 100, as described in FIG. 1. The process 700 can be automated by a photolithography system when an image sensor detects a wafer. Alternatively, the process 700 can begin when a technician using a computer connected to a photolithography system requests to align a wafer. The process begins at block 702 and continues to decision block 704. Also, in some embodiments, the process 700 is followed by the process 500 described above.

At block 702, a photolithography system receives wafer image data. In one embodiment, an image sensor in a photolithography system captures imaging data based on reflected light from a wafer. For example, the photolithography system can scan the wafer in the x and y directions to gather light intensity for (x, y) coordinates on the wafer. Alternatively, the photolithography system can use an image sensor to capture a digital image of the wafer and then process the digital image. In some embodiments, the imaging data is stored in memory. In other embodiments, the imaging data is sent to a computer over the Internet for storage and/or processing.

At decision block 704, the photolithography system determines whether a wafer image matches a template. As discussed at block 702, the received image data includes light intensity or brightness information corresponding to locations on the wafer. The photolithography system compares this received imaging data to stored template data with predetermined data such as light intensity and location for a predetermined template (also known as "an ideal" template). For example, the photolithography system stores templates for three-, four-, and five-via patterns with different arrangement patterns. In such an example, the photolithography system compares received data to these stored templates and determines that the imaging data matches a template (e.g., the five-via template). Once the wafer is determined to match a predefined template, the photolithography system can proceed to adjust the position of the wafer based on a comparison of the template and the received imaging data.

At block 706, the photolithography system aligns the wafer. The photolithography system aligns the wafer based on the comparison between the received imaging data and the predefined template data. The photolithography system can align the wafer to a reference location such as a camera center. For example, if the wafer has a five-via pattern, the photolithography system can adjust the center of one of the vias to be under the camera center. After block 706, the process 700 ends. In some embodiments, the process 700 can be followed by the process 600 or the process 500 as described above.

Via Pattern Template

Figure 8:
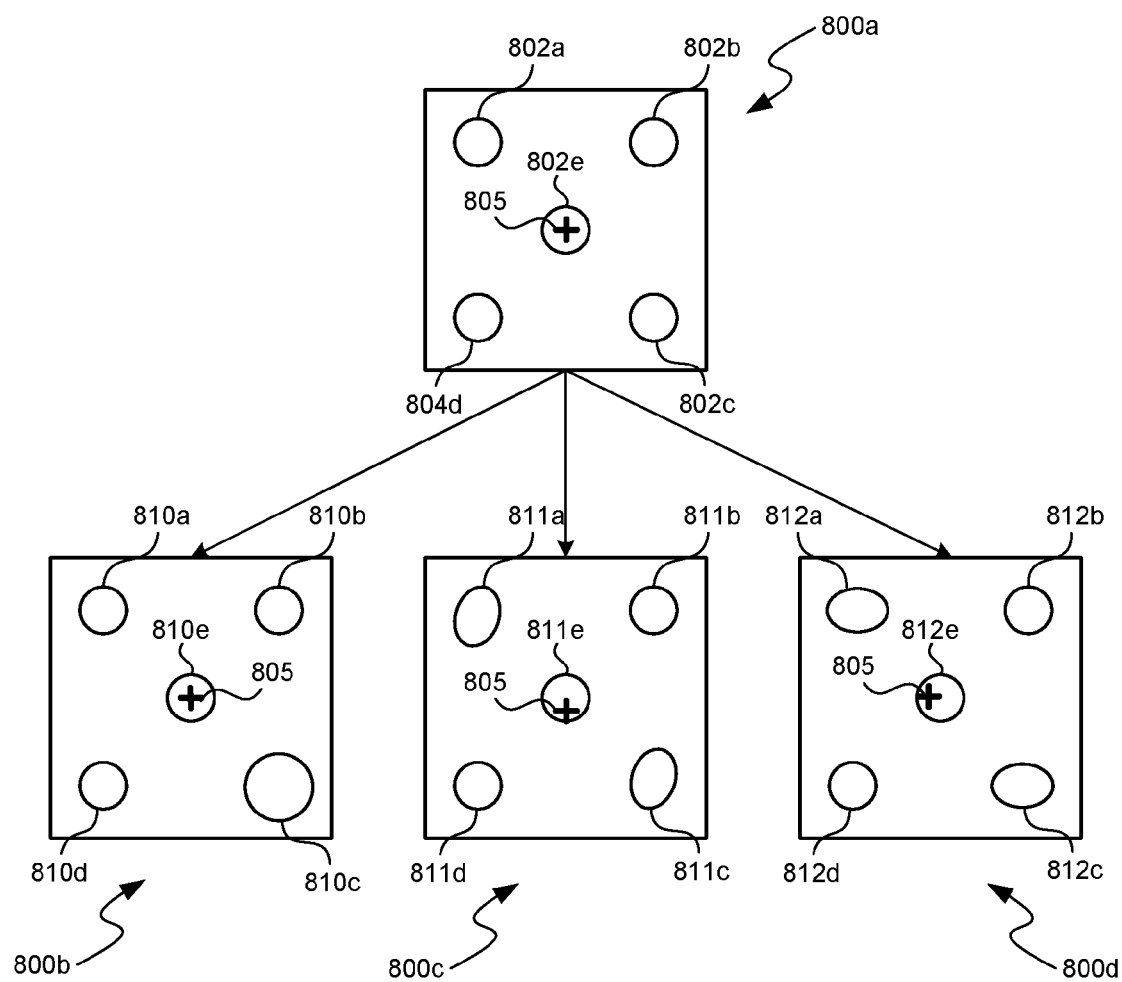
FIG. 8 illustrates a template and comparisons of the template to wafers in accordance with embodiments of the present technology.

FIG. 8 illustrates a template and comparisons of the template to wafers in accordance with embodiments of the present technology. A template is a predetermined via pattern (e.g., typically more than three, four, or five vias) with known via locations, via sizes (e.g., radius or diameter), via arrangements (e.g., two vias on the top, five vias on the bottom), and other properties (e.g., pitch or gradient of each via). The template can be stored in the memory of the photolithography system 100 described in FIG. 1 and used as a reference for verifying a via pattern on a wafer (e.g., determining the wafer has a five-via pattern versus a three-via pattern) and aligning a wafer to a tool or reference location. More details regarding alignment using a via template are described above with respect to FIGS. 6-7.

FIG. 8 shows a comparison between a reference template 800a that has five representative reference via locations 802a-e having the same shape and size and arranged as shown and three hypothetical via sets 800b-d that have a pattern of five vias 810a-e-812a-e on different wafers. The template 800a also has a center 805 that can be used as a reference location when aligning a wafer based on a comparison to the template. Also, in some embodiments, each template includes imaging data (e.g., hypothetical coordinates for locations and light intensity of vias and substrate) that can be compared to imaging data received for a wafer.

Although the via sets 800b-d have a pattern of five vias 810a-e-812a-e, the size and shape of vias 810a-e-812a-e vary in each wafer. Because the size and shape of via sets 800b-d on a wafer vary, the location of the center 805 varies in each template. Note, as shown in FIG. 8, the center 805 is representative data and may not be formed or exist on the wafer. Rather, the center 805 can be a reference point on the wafer that indicates a center mark or desired location on a template. In general, the template is used for coarse alignment of a wafer with a reference location or tool as described in FIGS. 6-7. The fine alignment procedures in accordance with the present technology described above with respect to FIGS. 2B and 4A-E can then further refine the alignment of the wafer to the processing tool.

Additional Examples of Via Templates and Via Patterns

Figure 9A:
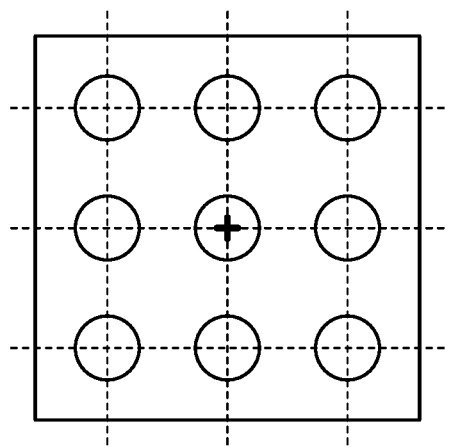
FIGS. 9A-I are various via patterns on a wafer that can be used in accordance with embodiments of the present technology.
Figure 9B:
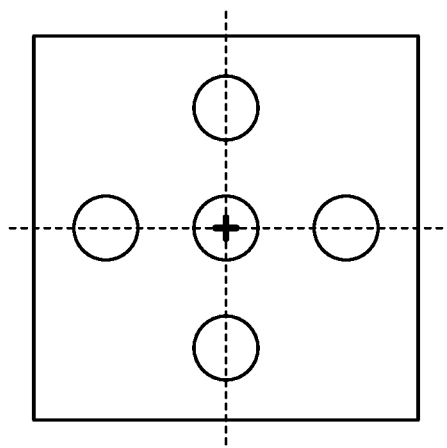
Figure 9C:
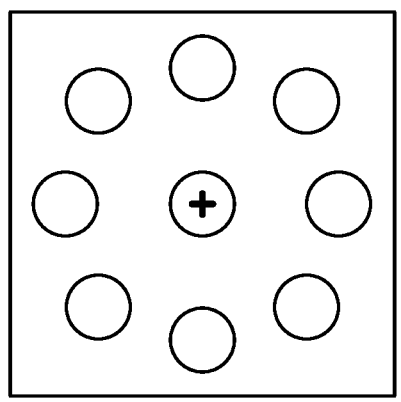
Figure 9D:
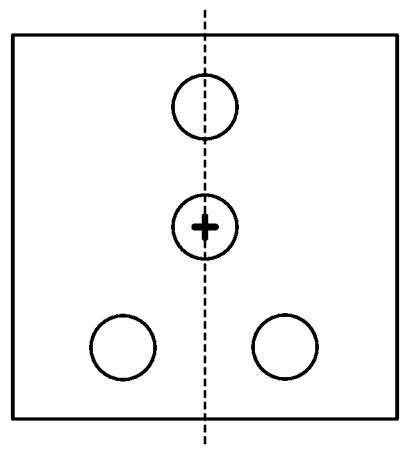
Figure 9E:
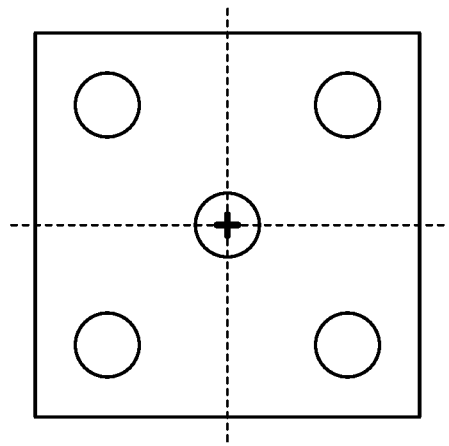
Figure 9F:
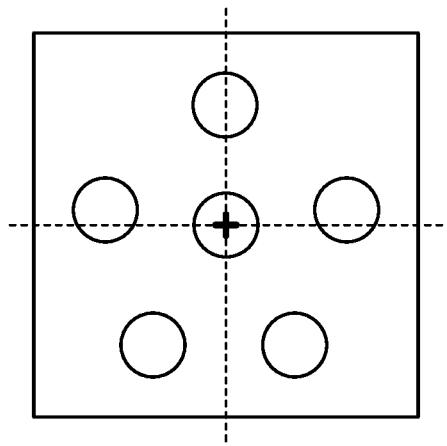
Figure 9G:
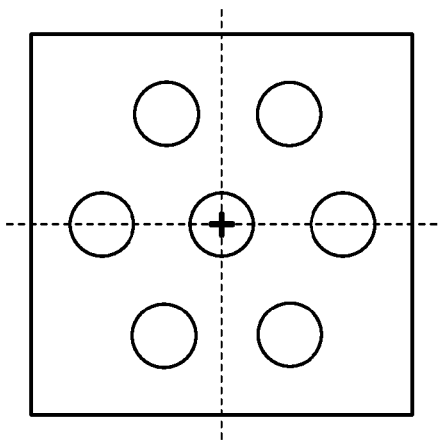
Figure 9H:
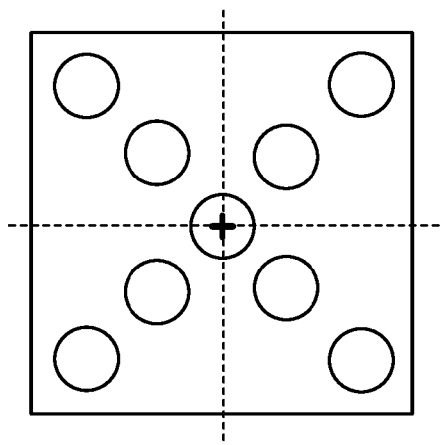
Figure 9I:
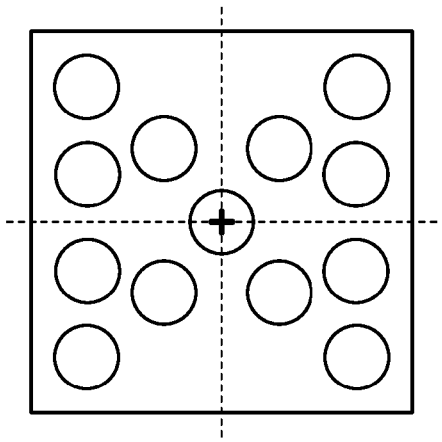

Although a via pattern with five vias is shown in FIGS. 2A-2B, 4A-E, and 8, a via pattern can be based on any number of vias or any arrangement of vias, such as those shown in FIGS. 9A-9I. As shown in FIGS. 9A-I, FIG. 9A has nine vias; FIG. 9B has five vias arranged in a different pattern compared to FIGS. 2A-2B, 4A-E, and 8; FIG. 9C has nine vias arranged in a different pattern compared to FIG. 9A; FIG. 9D has four vias; FIG. 9E has five vias arranged in a different pattern compared to FIG. 9B; FIG. 9F has six vias; FIG. 9G has seven vias; FIG. 9H has nine vias; and FIG. 9I has 13 vias. Although not shown in FIGS. 9A-9I, features such as size, shape, position, center location, and grid level of each via can vary. However, even if the features of a via vary, the photolithography system can align these various via patterns using the coarse and fine methods described above. Additionally, the photolithography system can store templates for wafers with varying numbers of vias (e.g., patterns with 2-20 or more vias) and use these templates for coarse alignment as described in the process 600.

Additionally, one advantage of increasing the number of vias and using embodiments of the individual via location alignment methods of the present technology is that the misalignment or misshape of a via has less of an effect on the center alignment. For example, if the substrate has five vias and one via is not aligned, the one misaligned via will affect the calculated average center by 20%. Yet, as the number of vias increases, the error is reduced. For example, if a substrate has six vias with one via misaligned, then the misaligned via will affect the calculated average center by approximately 16%. As another example, if there are eight vias and one via is misaligned, the misaligned via will affect the calculated average center by approximately 12.5%.

CONCLUSION

From the foregoing, it will be appreciated that specific embodiments of the technology have been described herein for purposes of illustration, but that various modifications may be made without deviating from the disclosure. For example, although the methods described herein refer to aligning an electrical feature to an exposed TSV at the back side of a semiconductor device, these methods could be utilized to create an alignment feature at the front side of the device. Also, many of the elements of one embodiment may be combined with other embodiments in addition to or in lieu of the elements of the other embodiments. Accordingly, the disclosure is not limited except as by the appended claims.

We claim:

1. A method for aligning a wafer, the method comprising:
performing a coarse alignment procedure by (a) estimating misalignment of the wafer based on a comparison of a set of vias fabricated on the wafer and a via template, and (b) adjusting a position of the wafer based on the estimated misalignment; and
after performing the coarse alignment procedure, performing a fine alignment procedure by (a) determining a center location of individual vias of the set of vias fabricated on the wafer, (b) averaging the center locations of the individual vias together to obtain an average center location of the set of vias, (c) comparing the average center location with a reference location, and (d) adjusting the position of the wafer based on the averaged center location comparison if the average center location is not within a described distance of the reference location.

2. The method of claim 1, wherein estimating misalignment of the wafer based on the comparison of the set of vias fabricated on the wafer and the via template further comprises receiving imaging data and comparing the imaging data to predetermined imaging data associated with the template.

3. The method of claim 1, wherein determining the center location of the individual vias further comprises computing an x and y coordinate for the individual vias in the set of vias and computing an average x and y coordinate for the average center location.

4. The method of claim 1, wherein determining the center location of the individual vias further comprises detecting light intensity reflected from the wafer.

5. A method for aligning a wafer, the method comprising:
determining a center location of individual vias of a set of vias fabricated on the wafer;
averaging the center locations of the individual vias together to obtain an average center location of the set of vias;
comparing the average center location with a reference location; and
adjusting a position of the wafer based on the comparison if the average center location is not within a prescribed distance of the reference location.

6. The method of claim 5, the method further comprising:
comparing the set of vias to a via template;
estimating misalignment of the wafer based on a comparison of the set of vias and the via template; and
adjusting the position of the wafer based on the estimated misalignment.

7. The method of claim 5, wherein determining the center location of the individual vias further comprises:
detecting intensity of light reflected from the set of vias.

8. The method of claim 5, wherein determining the center location of the individual vias further comprises:
determining the center location of the individual vias based on shape or image pattern recognition.

9. The method of claim 5, wherein the reference location is a center of a camera view field or a reference point associated with the wafer.

10. The method of claim 5, wherein adjusting the position of the wafer further comprises moving a substrate support configured to hold the wafer.

11. A non-transitory computer-readable storage medium containing instructions that, when executed by one or more processors, perform a method for aligning a wafer, the method comprising:
receiving digital imaging data of a set of vias fabricated on the wafer;
determining center locations of individual vias on the set of vias using the digital imaging data;
averaging the center locations of the individual vias on the set of vias to obtain an average center location;
comparing the average center location with a reference location; and
transmitting instructions to adjust or not adjust a position of the wafer based on the comparison between the average center location and the reference location.

12. The non-transitory computer-readable storage medium of claim 11, wherein determining the center location of the individual vias further comprises:
determining the center locations of the individual vias, partially based on detecting intensity of light reflected from the set of vias.

13. The non-transitory computer-readable storage medium of claim 11, wherein the reference location is the center of a camera view field or a reference point associated with the wafer.

14. A system for aligning a wafer, the system comprising:
an illumination source;
a substrate support configured to hold the wafer;
a controller configured to move the substrate support; the controller comprising a processor coupled to a memory, the memory storing instructions that, when executed by the processor, cause the system to:
determine center locations of individual vias of a set of vias fabricated on a wafer;
average the center locations of the individual vias together to obtain an average center location of the set of vias;
compare the average center location with a reference location; and
adjust a position of the wafer based on the comparison if the average center location is not within a prescribed distance of the reference location.

15. The system of claim 14, wherein the instructions further comprise causing the system to:
before determining the center locations of the individual vias, receive digital imaging data for at least a portion of the wafer;
determine that the portion of the wafer matches a template;
perform a coarse alignment procedure by estimating misalignment of the wafer based on a comparison of the portion of the wafer and the template; and
adjust the position of the wafer based on the estimated misalignment.

16. The system of claim 14, the system further comprising a mask or lens.

17. The system of claim 14, wherein the reference location is a center of a camera view field or a reference point associated with a via.

18. A method for aligning a wafer, the method comprising:
determining an offset of an average center location of a set of vias fabricated on the wafer with a reference center location of a via alignment template associated with the wafer, wherein the average center location of the set of vias is based on center locations of the individual vias in the set of vias; and
aligning the wafer by moving a substrate support carrying the wafer based on the determined offset.

19. The method of claim 18, the method further comprising:
before determining the offset of the average center location of the set of vias, performing a coarse alignment procedure by comparing the set of vias to a via template;
estimating misalignment of the wafer based on a comparison of the set of vias and the via template; and
adjusting a position of the wafer based on the estimated misalignment.

20. The method of claim 18, wherein determining an offset of an average center location of the individual vias further comprises:
determining a center location of the set of vias based on shape or image pattern recognition or detecting intensity of light reflected from the set of vias.

* * * * *